(12) United States Patent
Kishi et al.

(10) Patent No.: US 10,103,011 B2
(45) Date of Patent: Oct. 16, 2018

(54) PLASMA PROCESSING METHOD AND PLASMA PROCESSING APPARATUS

(71) Applicant: TOKYO ELECTRON LIMITED, Tokyo (JP)

(72) Inventors: Hiroki Kishi, Miyagi (JP); Jisoo Suh, Hwaseong-si (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/378,522

(22) Filed: Dec. 14, 2016

(65) Prior Publication Data

US 2017/0178872 A1 Jun. 22, 2017

(30) Foreign Application Priority Data

Dec. 17, 2015 (JP) ................. 2015-246537

(51) Int. Cl.
*H01J 37/32* (2006.01)
*H01L 21/3065* (2006.01)
*H01L 21/66* (2006.01)

(52) U.S. Cl.
CPC .. *H01J 37/32798* (2013.01); *H01J 37/32091* (2013.01); *H01J 37/32137* (2013.01); *H01J 37/32165* (2013.01); *H01J 37/32568* (2013.01); *H01J 37/32697* (2013.01); *H01J 37/32715* (2013.01); *H01J 37/32926* (2013.01); *H01L 21/3065* (2013.01); *H01J 2237/334* (2013.01);
(Continued)

(58) Field of Classification Search
CPC ........... H01J 37/32798; H01J 37/32568; H01J 37/32091; H01J 37/32926; H01J 37/32697; H01J 37/32165; H01J 37/32137; H01J 37/32715; H01J 2237/3343; H01J 2237/334; H01L 21/3065; H01L 22/12

See application file for complete search history.

(56) References Cited

U.S. PATENT DOCUMENTS 5,716,534 A * 2/1998 Tsuchiya ........... H01J 37/32082
216/67
6,488,863 B2 * 12/2002 Yatsuda ............ H01L 21/31116
216/72
(Continued)

FOREIGN PATENT DOCUMENTS

| CN | 102157372 A | 8/2011 |
| EP | 1780777 A1 | 5/2007 |
| JP | 2015005755 A | 1/2015 |

*Primary Examiner* — Anita K Alanko
(74) *Attorney, Agent, or Firm* — Brundidge & Stanger, P.C.

(57) ABSTRACT

A plasma processing apparatus 1 includes a chamber 10, a mounting table 16, a focus ring 24a, a first electrode plate 36 and a second electrode plate 35. The focus ring 24a is provided around the mounting table 16 to surround a mounting surface of the mounting table 16. The first electrode plate 36 is provided above the mounting table 16. The second electrode plate 35 is provided around the first electrode plate 36 to surround the first electrode plate 36 and is insulated from the first electrode plate 36. The plasma processing apparatus 1, in a first process, performs a preset processing on a semiconductor wafer W mounted on the mounting surface with plasma generated within the chamber, and, in a second process, increases an absolute value of a negative DC voltage applied to the second electrode plate 35 depending on an elapsed time of the first process.

3 Claims, 9 Drawing Sheets

(52) U.S. Cl.
CPC ....... *H01J 2237/3343* (2013.01); *H01L 22/12* (2013.01)

(56) References Cited

U.S. PATENT DOCUMENTS

| | | | |
|---|---|---|---|
| 2004/0171254 A1* | 9/2004 | Iijima | H01L 21/3065 438/689 |
| 2010/0025369 A1* | 2/2010 | Negishi | H01J 37/32642 216/60 |
| 2014/0311676 A1* | 10/2014 | Hatoh | H01L 21/68721 156/345.51 |
| 2015/0262794 A1* | 9/2015 | Kihara | H01J 37/32091 216/71 |

* cited by examiner

FIG. 5A
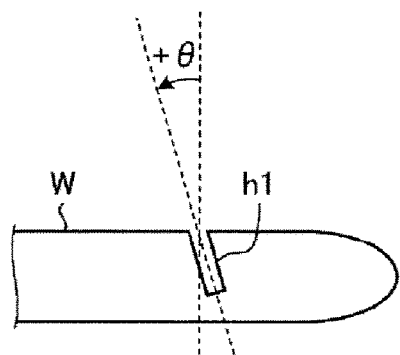
FIG. 5B
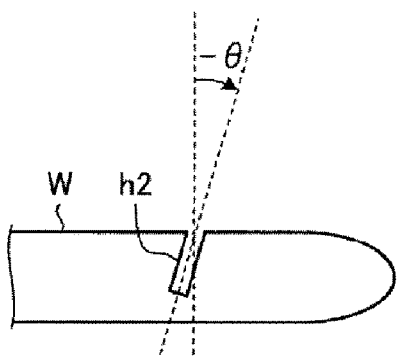
FIG. 6
| CENTER DC | EDGE DC | | | |
|---|---|---|---|---|
| | −150V | −300V | −500V | −900V |
| −150V | θ=0.57deg | − | − | θ=1.14deg |
| −300V | − | θ=0.52deg | − | − |
| −500V | θ=0.53deg | − | θ=0.69deg | θ=1.04deg |

PLASMA PROCESSING METHOD AND PLASMA PROCESSING APPARATUS

CROSS-REFERENCE TO RELATED APPLICATION

This application claims the benefit of Japanese Patent Application No. 2015-246537 filed on Dec. 17, 2015, the entire disclosures of which are incorporated herein by reference.

TECHNICAL FIELD

The embodiments described herein pertain generally to a plasma processing method and a plasma processing apparatus.

BACKGROUND

Conventionally, there is known a plasma processing apparatus which performs a processing, e.g., etching on a processing target substrate by using plasma. In such a plasma processing apparatus, the processing target substrate is placed on a mounting table which is provided within a chamber, and a processing gas is supplied into the chamber. Then, by applying a high frequency power into the chamber from an upper electrode which is disposed above the processing target substrate to face the processing target substrate on the mounting table, plasma of the processing gas is generated within the chamber. A preset plasma processing such as etching is performed on a surface of the processing target substrate by ions or radicals in the plasma. A negative DC voltage may be applied to the upper electrode.

Further, there is also known a plasma processing apparatus in which a ring-shaped conductive member, which is insulated from the upper electrode, is provided around the upper electrode (see, for example, Patent Document 1). A negative DC voltage having a magnitude different from that of the negative DC voltage applied to the upper electrode is applied to the conductive member.

Patent Document 1: Japanese Patent Laid-open Publication No. 2015-005755

In the plasma processing apparatus, a focus ring is provided around the mounting table to surround the processing target substrate placed on the mounting table. The focus ring is configured to improve uniformity of the plasma process such as etching which is performed on the processing target substrate. If, however, the plasma process is performed repeatedly in the plasma processing apparatus, the focus ring is consumed (worn). If the focus ring is consumed, the shape of the focus ring is changed, and so that a height relationship between a plasma sheath formed above the focus ring and a plasma sheath formed above the processing target substrate is changed. For this reason, the consumption of the focus ring causes a change in inclination angle of particles such as ions in the plasma when they reach the processing target substrate.

If the change in the inclination angle of the particles such as the ions in the plasma when they reach the processing target substrate is increased caused by the consumption of the focus ring, it may be difficult to suppress non-uniformity in inclination of a hole, which is formed on the processing target substrate, within a preset specification. Thus, the focus ring needs to be replaced before the non-uniformity in the inclination of the hole exceeds the preset specification. If the focus ring is replaced frequently, however, the process may be stopped whenever the focus ring is replaced, so that a throughput of the process is reduced.

SUMMARY

In one exemplary embodiment, there is provided a plasma processing method in which a first process and a second process are performed by a plasma processing apparatus. The plasma processing apparatus includes a chamber; a mounting table, provided within the chamber, having a mounting surface on which a processing target substrate is mounted; a focus ring provided around the mounting table to surround the mounting surface; a first upper electrode, provided above the mounting table, facing the mounting surface of the mounting table; and a second upper electrode which is provided around the first upper electrode to surround the first upper electrode and is insulated from the first upper electrode. The plasma processing apparatus performs, in the first process, a preset processing on the processing target substrate mounted on the mounting surface of the mounting table with plasma generated within the chamber. Further, the plasma processing apparatus increases, in the second process, an absolute value of a negative DC voltage applied to the second upper electrode depending on an elapsed time of the first process.

In the plasma processing method, a plasma processing apparatus performs a first process and a second process. The plasma processing apparatus includes a chamber, a mounting table, a focus ring, a first upper electrode and a second upper electrode. The mounting table is provided within the chamber and has a mounting surface on which a processing target substrate is mounted. The focus ring is provided around the mounting table to surround the mounting surface. The first upper electrode is provided above the mounting table and faces the mounting surface of the mounting table. The second upper electrode is provided around the first upper electrode to surround the first upper electrode and is insulated from the first upper electrode. The plasma processing apparatus performs, in the first process, a preset processing on the processing target substrate mounted on the mounting surface of the mounting table with plasma generated within the chamber. Further, the plasma processing apparatus increases, in the second process, an absolute value of a negative DC voltage applied to the second upper electrode depending on an elapsed time of the first process.

The plasma processing apparatus may determine, in the second process, the absolute value of the negative DC voltage applied to the second upper electrode based on first data indicating an inclination angle of a hole formed in the vicinity of an edge of the processing target substrate with respect to the elapsed time of the first process and second data indicating the inclination angle of the hole formed in the vicinity of the edge of the processing target substrate with respect to the absolute value of the negative DC voltage applied to the second upper electrode.

The second data may be created for each of values of DC voltages applied to the first upper electrode. Further, the plasma processing apparatus may specify, in the second process, the second data corresponding to the value of the DC voltage applied to the first upper electrode, and may determine the absolute value of the negative DC voltage applied to the second upper electrode based on the specified second data and the first data.

In another exemplary embodiment, a plasma processing apparatus includes a chamber, a mounting table, a focus ring, a first upper electrode, a second upper electrode and a controller. The mounting table is provided within the chamber and has a mounting surface on which a processing target substrate is mounted. The focus ring is provided around the mounting table to surround the mounting surface. The first upper electrode is provided above the mounting table and faces the mounting surface. The second upper electrode is provided around the first upper electrode to surround the first upper electrode, and is insulated from the first upper electrode. The controller is configured to perform a control of increasing an absolute value of a negative DC voltage applied to the second upper electrode depending on an elapsed time of a preset processing performed on the processing target substrate with plasma generated within the chamber.

The plasma processing apparatus may further include a storage unit configured to store first data indicating an inclination angle of a hole formed in the vicinity of an edge of the processing target substrate with respect to the elapsed time of the preset processing and second data indicating the inclination angle of the hole formed in the vicinity of the edge of the processing target substrate with respect to the absolute value of the negative DC voltage applied to the second upper electrode. Further, the controller reads out the first data and the second data from the storage unit, and determines the absolute value of the negative DC voltage applied to the second upper electrode based on the read-out first data and the second data.

The storage unit may store the second data for each of values of DC voltages applied to the first upper electrode. Further, the controller may specify, among the second data stored in the storage unit, the second data corresponding to the value of the DC voltage applied to the first upper electrode, and may determine the absolute value of the negative DC voltage applied to the second upper electrode based on the specified second data and the first data.

The second upper electrode may have a circular ring shape, and the second upper electrode may be disposed around the first upper electrode such that an inner circumferential surface of the second upper electrode is located at a position further from an axis line of the focus ring as a reference than an inner circumferential surface of the focus ring.

According to the exemplary embodiment as stated above, it is possible to suppress the change in the inclination of the hole which might be caused by the consumption of the focus ring.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 5A and FIG. 5B are diagrams for describing a definition of an inclination angle of a hole in the present exemplary embodiment;

FIG. 6 is a diagram illustrating an example of a measurement result of the inclination angle (θ) of the hole for each of various combinations of a center DC and an edge DC;

DETAILED DESCRIPTION

Figure 1:
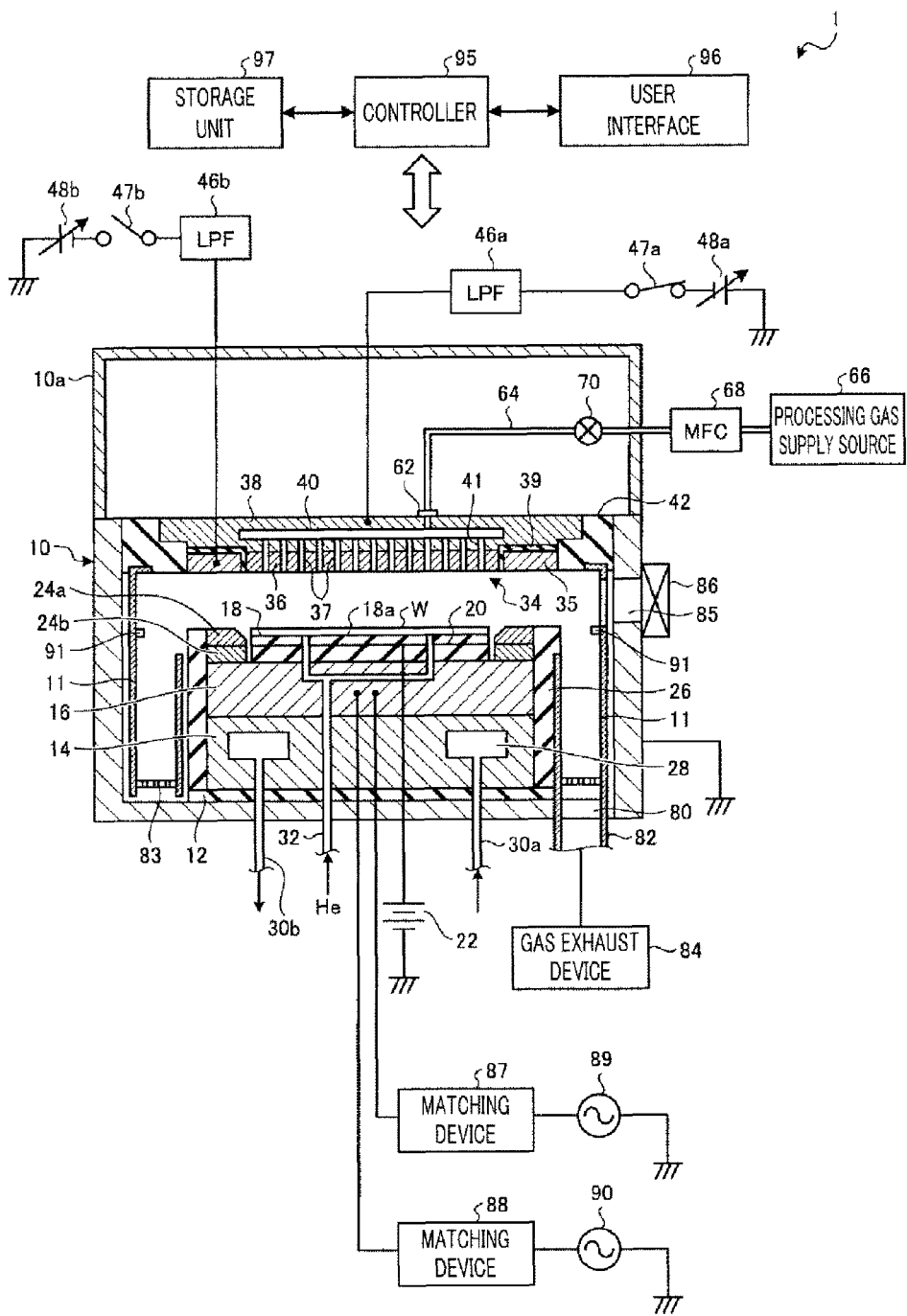
FIG. 1 is a cross sectional view schematically illustrating an example of an overall configuration of a plasma processing apparatus.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, the plasma processing method and the plasma processing apparatus disclosed according to the exemplary embodiments will be described in detail with reference to the accompanying drawings. However, it should be noted that the present exemplary embodiments are not limiting.

[Configuration of Plasma Processing Apparatus 1]

FIG. 1 is a cross sectional view schematically illustrating an example of an overall configuration of a plasma processing apparatus 1. The plasma processing apparatus 1 according to the exemplary embodiment is configured as, for example, a capacitively coupled parallel plate type plasma etching apparatus. The plasma processing apparatus 1 includes a substantially cylindrical chamber 10 formed of, by way of example, but not limitation, aluminium having an anodically oxidized surface. The chamber 10 is frame-grounded.

A supporting table 14 having a circular column shape is provided at a bottom portion of the chamber 10 with an insulating plate 12 made of ceramics or the like placed therebetween. A mounting table 16 made of, by way of non-limiting example, aluminium is provided on the supporting table 14. The mounting table 16 serves as a lower electrode.

An electrostatic chuck 18 configured to attract and hold a semiconductor wafer W as an example of a processing target substrate by an electrostatic force is disposed on a top surface of the mounting table 16. The electrostatic chuck 18 has a structure in which an electrode 20 made of a conductive film is embedded between a pair of insulating layers or insulating sheets. The electrode 20 is electrically connected to a DC power supply 22. The semiconductor wafer W is placed on a top surface 18a of the electrostatic chuck 18 and is attracted to and held by the electrostatic chuck 18 by an electrostatic force such as a Coulomb force generated by a DC voltage applied from the DC power supply 22. The top surface 18a of the electrostatic chuck 18 on which the semiconductor wafer W is placed is an example of a mounting surface of the mounting table 16.

A conductive member 24b is provided on the top surface of the mounting table 16 to surround the electrostatic chuck 18. Further, a conductive focus ring 24a made of, for example, silicon is provided on the conductive member 24b to surround the top surface 18a of the electrostatic chuck 18. Uniformity of the plasma process such as etching is improved by the focus ring 24a. A cylindrical inner wall member 26 made of, for example, quartz is provided on side surfaces of the mounting table 16 and the supporting table 14.

An annular coolant path 28 is formed within the supporting table 14. A coolant of a preset temperature, e.g., cooling water is supplied into and circulated through the coolant path 28 from a non-illustrated external chiller unit via a line 30a and a line 30b. Temperatures of the supporting table 14, the mounting table 16 and the electrostatic chuck 18 are controlled by the coolant which is circulated within the coolant path 28, so that the semiconductor wafer W on the electrostatic chuck 18 is controlled to have a predetermined temperature.

Further, a heat transfer gas such as, but not limited to, a He gas from a non-illustrated heat transfer gas supply unit is supplied into a gap between the top surface 18a of the electrostatic chuck 18 and a rear surface of the semiconductor wafer W via a line 32.

An upper electrode 34 is provided above the mounting table 16, facing the mounting table 16 which serves as the lower electrode. A space between the upper electrode 34 and the mounting table 16 is a plasma generation space. The upper electrode 34 forms a surface (i.e., facing surface) which faces the semiconductor wafer W on the mounting table 16 serving as the lower electrode while being in contact with the plasma generation space.

The upper electrode 34 is supported at an upper portion of the chamber 10 with an insulating shielding member 42 therebetween. The upper electrode 34 is equipped with a first electrode plate 36, a second electrode plate 35 and an electrode supporting body 38. The first electrode plate 36 forms the facing surface which faces the mounting table 16 and is provided with a multiple number of gas discharge holes 37. Desirably, the first electrode plate 36 and the second electrode plate 35 are made of a semiconductor or a conductor having low resistance and low Joule heat, for example, silicon or SiC. The second electrode plate 35 has an annular shape and is provided around the first electrode plate 36 to surround the first electrode plate 36. The second electrode plate 35 is located at a position above the focus ring 24a. The second electrode plate 35 is insulated from the first electrode plate 36 by an insulating member 39. The first electrode plate 36 is an example of a first upper electrode, and the second electrode plate 35 is an example of a second upper electrode.

Figure 2:
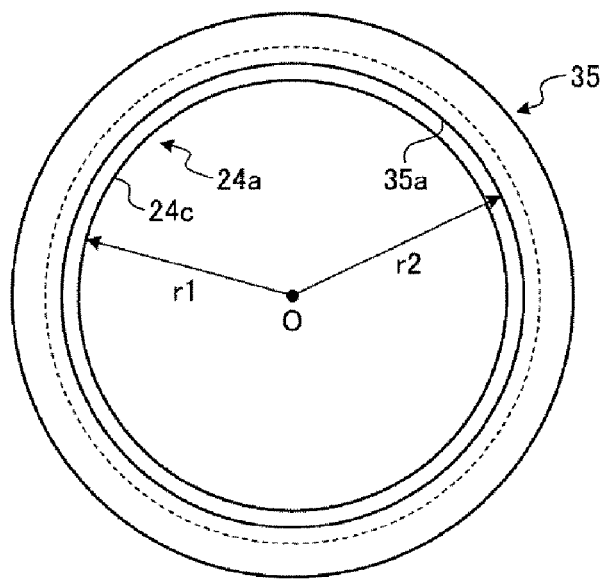
FIG. 2 is a top view schematically illustrating an example of a positional relationship between a focus ring and a second electrode plate.
Figure 3:
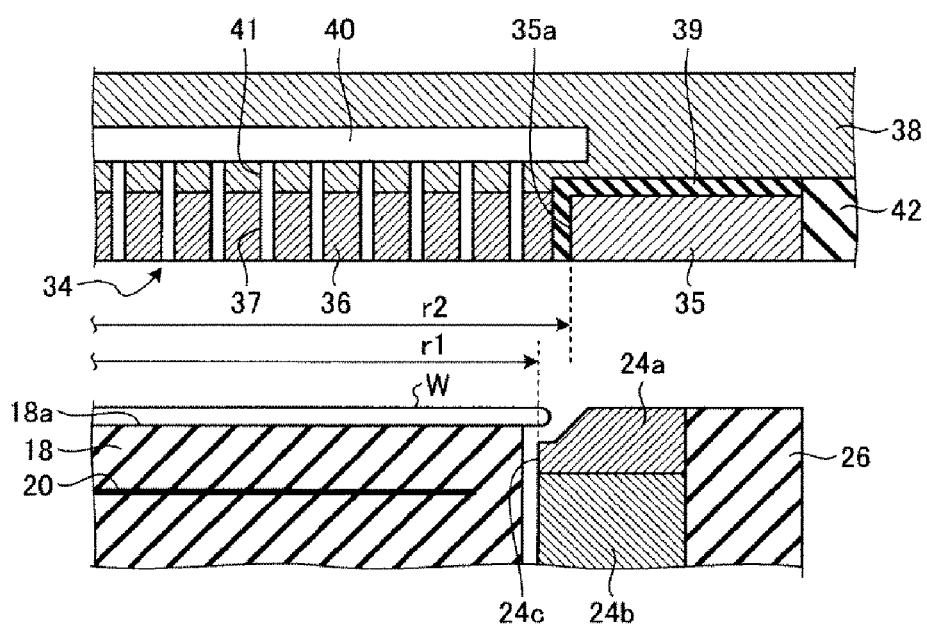
FIG. 3 is an enlarged cross sectional view schematically illustrating the example of the positional relationship between the focus ring and the second electrode plate.

FIG. 2 is a top view schematically illustrating an example of a positional relationship between the focus ring 24a and the second electrode plate 35. FIG. 3 is an enlarged cross sectional view schematically illustrating an example of the positional relationship between the focus ring 24a and the second electrode plate 35. FIG. 2 illustrates the focus ring 24a and the second electrode 35 viewed from a direction heading toward the mounting table 16 from the upper electrode 34. As depicted in FIG. 2, each of the focus ring 24a and the second electrode plate 35 has a circular ring shape, and central axes of the focus ring 24a and the second electrode plate 35 are substantially coincident. A point O in FIG. 2 indicates a point through which the central axes of the focus ring 24a and the second electrode plate 35 pass. In the present exemplary embodiment, a radius r1 of an inner circumferential surface 24c of the focus ring 24a is shorter than a radius r2 of an inner circumferential surface 35a of the second electrode plate 35, as shown in FIG. 2 and FIG. 3. As another exemplary embodiment, the radius r1 of the inner circumferential surface 24c of the focus ring 24a may be equal to the radius r2 of the inner circumferential surface 35a of the second electrode plate 35.

Referring back to FIG. 1, the electrode supporting body 38 is configured to support the first electrode plate 36 and the second electrode plate 35 in a detachable manner. Further, the electrode supporting body 38 has a water-cooling structure which is formed of a conductive material such as, but not limited to, aluminum having an anodically oxidized surface. A gas diffusion space 40 is formed within the electrode supporting body 38. A multiple number of gas through holes 41 are extended downwards from the gas diffusion space 40 to communicate with the gas discharge holes 37, respectively.

The electrode supporting body 38 is provided with a gas inlet opening 62 through which a processing gas is introduced into the gas diffusion space 40, and a gas supply line 64 is connected to the gas inlet opening 62. The gas supply line 64 is connected to a processing gas supply source 66 via a valve 70 and a mass flow controller (MFC) 68. When performing an etching process on the semiconductor wafer W, a processing gas for etching is supplied into the gas diffusion space 40 from the processing gas supply source 66 through the gas supply line 64. The processing gas supplied into the gas diffusion space 40 is diffused within the gas diffusion space 40, and then, is discharged into a plasma processing space through the gas through holes 41 and the gas discharge holes 37 in a shower shape. That is, the upper electrode 34 also serves as a shower head configured to supply the processing gas into the plasma processing space.

The electrode supporting body 38 is electrically connected to a variable DC power supply 48a via a low pass filter (LPF) 46a and a switch 47a. The variable DC power supply 48a is configured to output a negative DC voltage having a magnitude (absolute value) set by a controller 95 to be described later. The switch 47a is configured to control a supply and a stop of the supply of the negative DC voltage to the electrode supporting body 38 from the variable DC power supply 48a. In the following description, the negative DC voltage supplied from the variable DC power supply 48a to the electrode supporting body 38 may be referred to as "center DC."

The second electrode plate 35 is electrically connected to a variable DC power supply 48b via a low pass filter (LPF) 46b and a switch 47b. The variable DC power supply 48b is configured to output a negative DC voltage having a magnitude (absolute value) set by the controller 95 to be described later. The switch 47b is configured to control a supply and a stop of the supply of the negative DC voltage to the second electrode plate 35 from the variable DC power supply 48b. In the following description, the negative DC voltage supplied from the variable DC power supply 48b to the second electrode plate 35 may be referred to as "edge DC."

A cylindrical grounding conductor 10a is extended upwards from a sidewall of the chamber 10 up to a position higher than the upper electrode 34. The grounding conductor 10a has a ceiling wall at an upper portion thereof.

The mounting table 16 serving as the lower electrode is electrically connected to a first high frequency power supply 89 via a matching device 87. Further, the mounting table 16 is electrically connected to a second high frequency power supply 90 as well via a matching device 88. The first high frequency power supply 89 is configured to output a high frequency power having a frequency equal to or higher than 27 MHz, e.g., 40 MHz. The second high frequency power supply 90 is configured to output a high frequency power having a frequency equal to or lower than 13.56 MHz, e.g., 2 MHz.

The matching device 87 is configured to match a load impedance and an impedance of the first high frequency power supply 89 such that the load impedance and the impedance of the first high frequency power supply 89 are apparently matched when the plasma is generated within the chamber 10. Likewise, the matching device 88 is configured to match a load impedance and an impedance of the second high frequency power supply 90 such that the load impedance and the impedance of the second high frequency power supply 90 are apparently matched when the plasma is generated within the chamber 10.

A gas exhaust opening 80 is formed at the bottom portion of the chamber 10. The gas exhaust opening 80 is connected with a gas exhaust device 84 via a gas exhaust line 82. The gas exhaust device 84 includes a vacuum pump such as, but not limited to, a turbo molecular pump and is capable of decompressing the inside of the chamber 10 to a required vacuum level. Further, an opening 85 through which the semiconductor wafer W is carried in and out is formed at a sidewall of the chamber 10, and the opening 85 is opened or closed by a gate valve 86.

A deposition shield 11 configured to suppress an etching byproduct (deposit) from adhering to an inner wall of the chamber 10 is provided along the inner wall of the chamber 10 in a detachable manner. Further, the deposition shield 11 is also provided on an outer surface of the inner wall member 26. A gas exhaust plate 83 is provided between the deposition shield 11 on the side of the chamber inner wall at a lower portion of the chamber 10 and the deposition shield 11 on the side of the inner wall member 26. The deposition shield 11 and the gas exhaust plate 83 are appropriately prepared by coating an aluminum member with ceramics such as $Y_2O_3$.

A conductive member (GND block) 91 which is DC-connected to the ground is provided at a portion of the deposition shield 11 on the chamber inner wall such that it is located at a position substantially level with the semiconductor wafer W in a height direction. The GND block 91 suppresses an abnormal discharge within the chamber 10.

Individual components of the plasma processing apparatus 1 are controlled by the controller 95. The controller 95 is connected with a user interface 96 which includes a keyboard through which a process manager inputs a command to manage the plasma processing apparatus 1; a display configured to visually display an operational status of the plasma processing apparatus 1; and so forth.

Further, the controller 95 is also connected with a storage unit 97 having stored thereon a control program for implementing various processings performed in the plasma processing apparatus 1 under the control of the controller 95, and a program for allowing each component of the plasma processing apparatus 1 to perform a certain processing according to processing conditions, i.e., recipes. Furthermore, the storage unit 97 also stores therein data of a first table and a second table to be described later. The storage unit 97 may be implemented by, for example, a hard disk or a semiconductor memory. Alternatively, the storage unit 97 may be implemented by a portable computer-readable recording medium. In this case, the controller 95 acquires the control program and the like stored in the recording medium through a device which is configured to read data from this recording medium. The recording medium may be, by way of example, but not limitation, a CD-ROM or a DVD.

The controller 95 retrieves and executes a necessary recipe from the storage unit 97 in response to the instruction from the user through the user interface 96, so that the individual components of the plasma processing apparatus 1 are controlled and a preset plasma processing is performed on the semiconductor wafer W. Further, in the present exemplary embodiment, the plasma processing apparatus 1 includes the controller 95, the user interface 96 and the storage unit 97.

When the etching process on the semiconductor wafer W is performed in the plasma processing apparatus 1 having the above-described configuration, the gate valve 86 is first opened, and the semiconductor wafer W as the etching target is carried into chamber 10 through the opening 85 to be mounted on the electrostatic chuck 18. The preset DC voltage from the DC power supply 22 is applied to the electrostatic chuck 18, and the semiconductor wafer W is attracted to and held on the top surface 18a of the electrostatic chuck 18.

The processing gas for etching is supplied into the gas diffusion space 40 from the processing gas supply source 66 at a preset flow rate and is supplied into the chamber 10 through the gas through holes 41 and the gas discharge holes 37. Further, the chamber 10 is exhausted by the gas exhaust device 84, and the internal pressure of the chamber 10 is controlled to a preset pressure. In the state that the processing gas is supplied into the chamber 10, the high frequency power for plasma generation is applied to the mounting table 16 at a preset power level from the first high frequency power supply 89, and the high frequency power for ion attraction is supplied to the mounting table 16 from the second high frequency power supply 90 at a predetermined power level. Further, the negative DC voltage having a preset magnitude is applied to the electrode supporting body 38 from the variable DC power supply 48a, and the negative DC voltage having a predetermined magnitude is applied from the variable DC power supply 48b to the second electrode plate 35.

The processing gas discharged from the gas discharge holes 37 of the upper electrode 34 is excited into plasma in a glow discharge which is generated between the upper electrode 34 and the mounting table 16 by the high frequency power applied to the mounting table 16. A processing target surface of the semiconductor wafer W is etched by radicals or ions in the plasma.

Furthermore, in the preset exemplary embodiment, the controller 95 increase the magnitude of the negative DC voltage applied to the second electrode plate 35 by controlling the variable DC power supply 48b with the lapse of a plasma processing time.

[Relationship Between Plasma Processing Time and Inclination Angle of Hole]

Figure 4A:
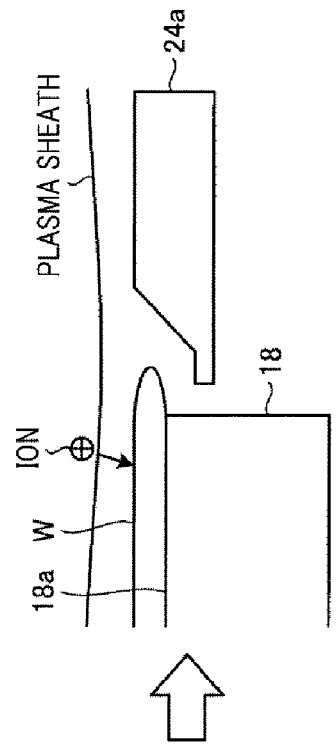
FIG. 4A and FIG. 4B are diagrams for describing a change in an inclination of an incident direction of ions caused by consumption of the focus ring.
Figure 4B:
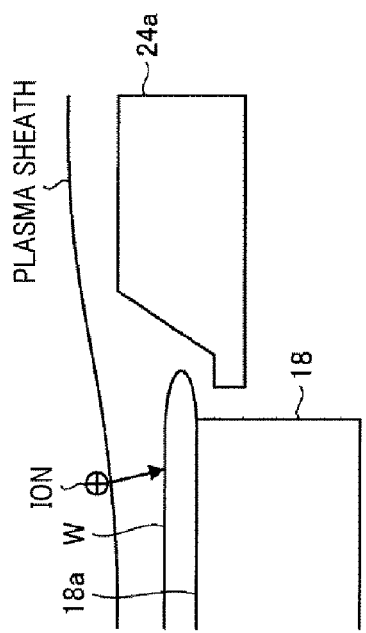

Here, a relationship between a plasma processing time and an inclination angle of a hole formed on the processing target surface of the semiconductor wafer W will be explained. FIG. 4A and FIG. 4B are explanatory diagrams showing a change in inclination of an incident direction of ions, which is caused by consumption of the focus ring 24a. In case that the focus ring 24a is not consumed, a plasma sheath above the focus ring 24a is formed at a position higher than a plasma sheath above the semiconductor wafer W, as illustrated in FIG. 4A, for example. In this case, in the vicinity of a peripheral portion (edge) of the semiconductor wafer W, the ions in the plasma reach the semiconductor wafer W in an inclined direction toward the peripheral portion of the processing target surface of the semiconductor wafer W. In the etching process, the hole is formed along the incident direction of the ions. Thus, the hole formed in the vicinity of the peripheral portion of the processing target surface of the semiconductor wafer W has a depth-directional shape which is inclined toward the peripheral portion of the processing target surface of the semiconductor wafer W with respect to a vertical direction.

Afterwards, if the plasma processing is repeated and the focus ring 24a is consumed by the plasma, the height of the focus ring 24a is lowered, as depicted in FIG. 4B, for example. Accordingly, as depicted in FIG. 4B, the position of the plasma sheath above the focus ring 24a is lowered, so that the position of the plasma sheath formed above the vicinity of the peripheral portion of the semiconductor wafer W becomes lower than the plasma sheath formed above the vicinity of the central portion of the semiconductor wafer W. As a result, in the vicinity of the peripheral portion of the semiconductor wafer W, the ions in the plasma reach in the inclined direction toward the central portion of the processing target surface of the semiconductor wafer W. Thus, the hole formed in the vicinity of the peripheral portion of the processing target surface of the semiconductor wafer W has a depth-directional shape which is inclined toward the central portion of the processing target surface of the semiconductor wafer W with respect to the vertical direction.

Here, definition of the inclination angle of the depth direction of the hole will be discussed. FIG. 5A and FIG. 5B are diagrams for describing the definition of the inclination angle of the hole in the preset exemplary embodiment. In the present exemplary embodiment, an inclination angle $\theta$ of the hole is defined as an angle of the depth direction of the hole with respect to a vertical direction, as depicted in FIG. 5A and FIG. 5B, for example. For example, as depicted in FIG. 5A, in case that a hole h1 formed on the semiconductor wafer W is inclined toward the peripheral portion of the processing target surface of the semiconductor wafer W, the inclination angle $\theta$ of the hole has a positive value. On the other hand, as depicted in FIG. 5B, in case that a hole h2 formed on the semiconductor wafer W is inclined toward the central portion of the processing target surface of the semiconductor wafer W, the inclination angle $\theta$ of the hole has a negative value.

In the example shown in FIG. 4A and FIG. 4B, the focus ring 24a having a shape which allows the inclination angle $\theta$ of the hole to have a preset positive value (e.g., $\theta=+0.5$ deg) in the state that the focus ring 24a is not consumed is provided in the chamber 10. With the lapse of the plasma processing time, the focus ring 24a is consumed, and the inclination angle $\theta$ of the hole is decreased and soon becomes to have a negative value. Then, with a further lapse of the plasma processing time, the focus ring 24a is consumed more, and the inclination angle $\theta$ is given a larger negative value. The focus ring 24a is replaced before the inclination angle $\theta$ of the hole becomes to have a negative value of a preset magnitude (e.g., $\theta=-0.5$ deg).

[Relationship Between Edge DC and Inclination Angle $\theta$]

Figure 7:
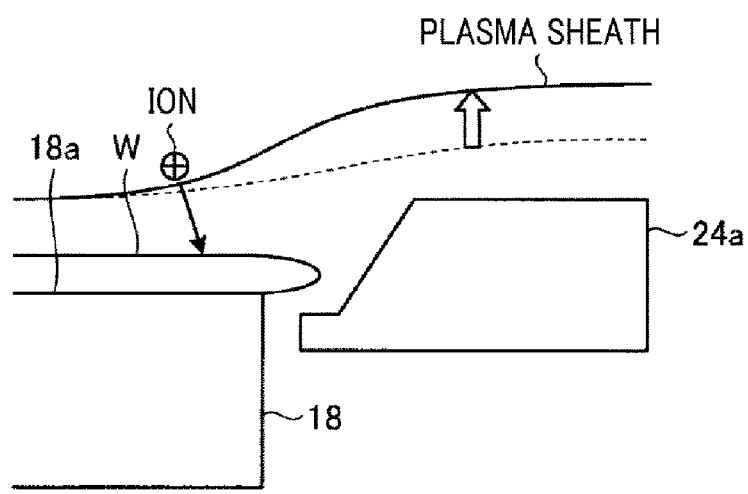
FIG. 7 is a diagram illustrating an example of a change in a position of a plasma sheath when an absolute value of a negative DC voltage applied to the second electrode plate is increased.

Now, a relationship between the edge DC and the inclination angle $\theta$ of the hole will be explained. FIG. 6 is a diagram illustrating an example of a measurement result of the inclination angle $\theta$ of the hole for each of various combinations of the center DC and the edge DC. Referring to the measurement result of FIG. 6, with a rise of an absolute value of the edge DC which is a negative DC voltage applied to the second electrode plate 35, the inclination angle $\theta$ of the hole is increased in a positive direction. If the absolute value of the negative DC voltage applied to the second electrode plate 35 is increased, the plasma sheath above the focus ring 24a is moved toward the second electrode plate 35, i.e., in an upward direction, as shown in FIG. 7. FIG. 7 is a diagram illustrating an example of a change in the position of the plasma sheath when the absolute value of the negative DC voltage applied to the second electrode plate 35 is increased. Accordingly, it is deemed that the incident direction of ions is inclined toward the peripheral portion of the processing target surface of the semiconductor wafer W, so that the inclination angle $\theta$ of the hole formed by incidence of the ions is inclined in the positive direction.

Figure 8A:
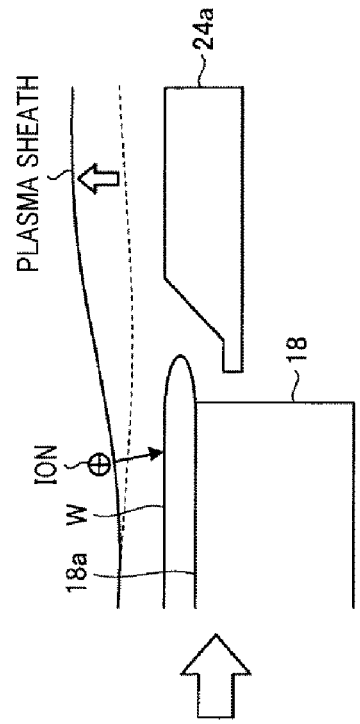
FIG. 8A and FIG. 8B are diagrams for describing the inclination of the incident direction of the ions caused by the consumption of the focus ring in the exemplary embodiment.
Figure 8B:
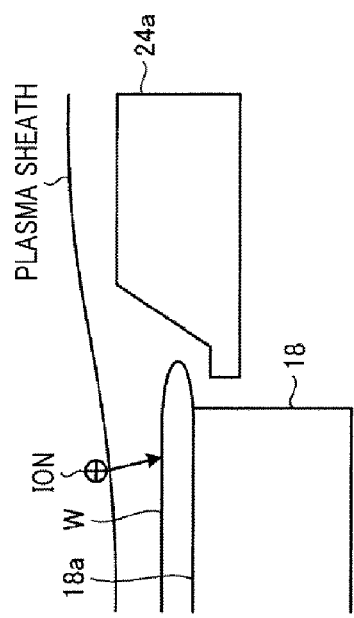

In view of this, as shown in FIG. 8A and FIG. 8B, even if the position of the plasma sheath is lowered as the focus ring 24a is consumed with the lapse of the plasma processing time, it is deemed that the change of the inclination angle $\theta$ of the hole which might be caused by the consumption of the focus ring 24a can be suppressed if the magnitude (absolute value) of the edge DC applied to the second electrode plate 35 is increased.

[First Table]

Now, a method of creating a first table for determining a value of the edge DC will be explained. First, the inclination angle $\theta$ of the hole with respect to the plasma processing time is measured. For example, an etching process is actually performed on a multiple number of semiconductor wafers W, and the inclination angles $\theta$ of the holes formed on the semiconductor wafers W are measured for each accumulation time of the plasma processing. As another example, an etching process may be performed on a semiconductor wafer W by using a focus ring 24a which is prepared such that its height is decreased as much as a consumption amount depending on an accumulation time of the plasma processing, and the inclination angle $\theta$ of the hole formed on the semiconductor wafer W may be measured.

Figure 9:
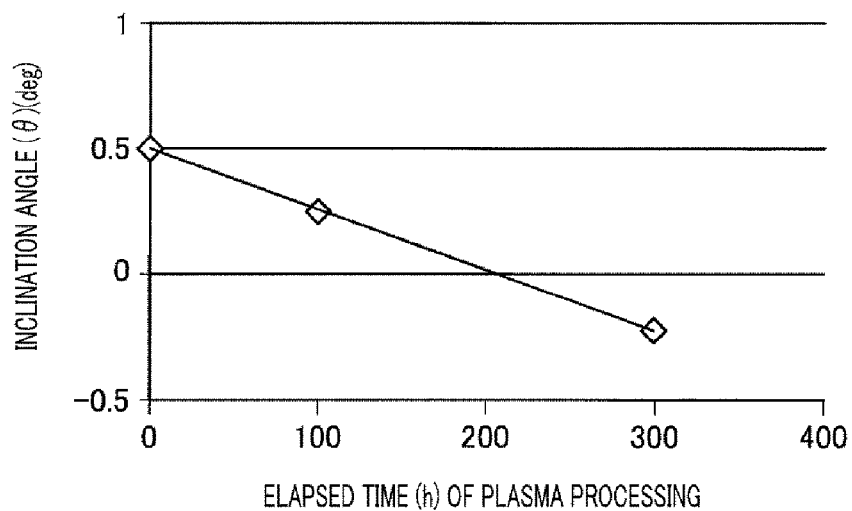
FIG. 9 is a diagram illustrating an example of a relationship between a plasma processing time and the inclination angle of the hole.

From the measurement result of the inclination angle $\theta$ of the hole for each plasma processing time, a variation amount of the inclination angle $\theta$ of the hole per a unit time of the plasma processing is calculated. A measurement value of the inclination angle $\theta$ of the hole for each plasma processing time is as illustrated in FIG. 9, for example. FIG. 9 is a diagram illustrating an example of a relationship between the plasma processing time and the inclination angle of the hole. In the example of FIG. 9, the variation amount of the inclination angle θ with respect to the unit time of the plasma processing is found to be −0.023 deg per 10 hours.

Figure 10:
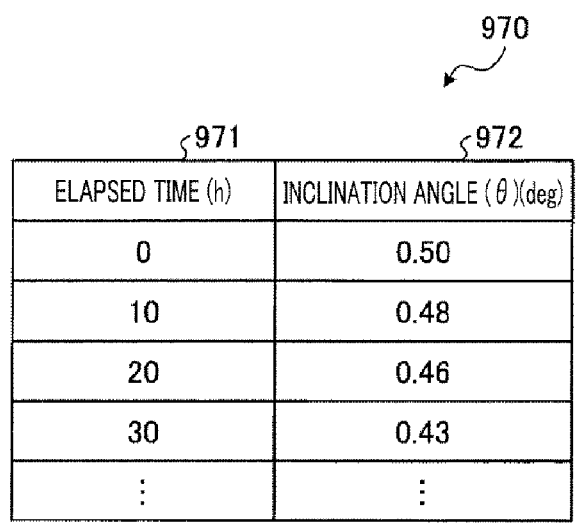
FIG. 10 is a diagram illustrating an example of a first table.

The value of the inclination angle θ for each elapsed time of the plasma processing is stored in the storage unit 97 as a first table. FIG. 10 is a diagram illustrating an example of a first table 970. In the first table 970, the inclination angle θ (972) of the hole is stored in correspondence to the elapsed time 971 of the plasma processing, as shown in FIG. 10, for example. Further, in the example of FIG. 10, though an initial value of the inclination angle θ (972) of the hole is 0.50 deg, the initial value of the inclination angle θ (972) of the hole may have another value of, e.g., 0 deg. The first table 970 is an example of first data.

[Second Table]

Figure 11:
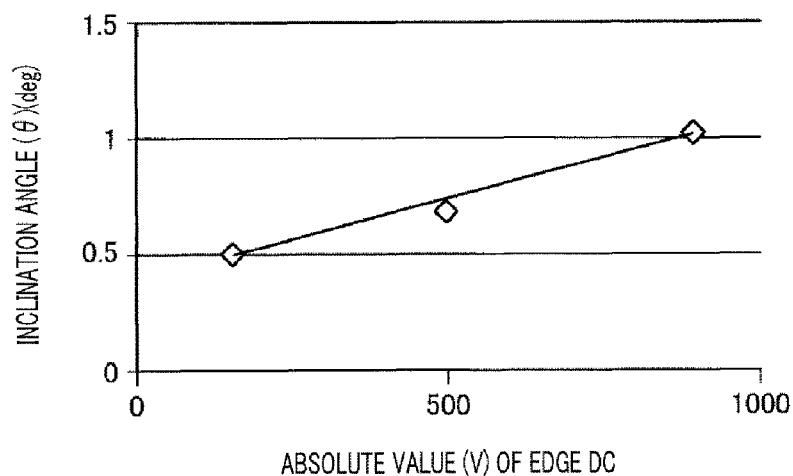
FIG. 11 is a diagram illustrating an example of a change of the inclination angle of the hole with respect to a voltage variation of the edge DC.

Now, a method of creating a second table for determining a value of the edge DC will be explained. First, the inclination angle θ of the hole is measured for each of the combinations of the center DC and the edge DC, as shown in FIG. 6, for example. Then, for each value of the center DC, a variation amount of the inclination angle θ with respect to a voltage variation of the edge DC is calculated from a measurement result of the inclination angle θ of the hole with respect to the edge DC. A measurement value of the inclination angle θ of the hole with respect to the edge DC is as illustrated in FIG. 11, for example. FIG. 11 is a diagram illustrating the variation of the inclination angle of the hole with respect to the voltage variation of the edge DC. In the measurement result shown in FIG. 11, the center DC is −150 V. Further, in the example of FIG. 11, the variation amount of the inclination angle θ with respect to the voltage variation of the edge DC is 0.007 deg per 10 V.

Figure 12:
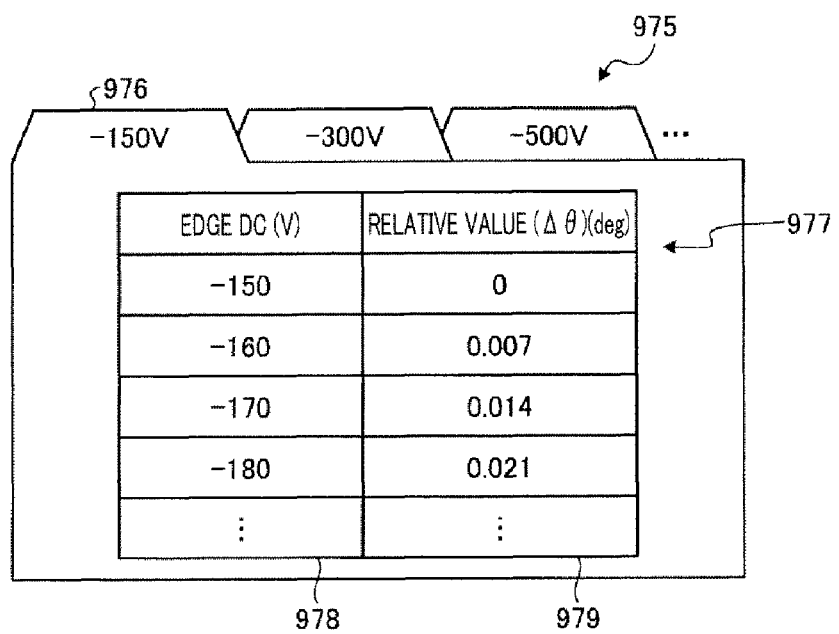
FIG. 12 is a diagram illustrating an example of a second table.

Further, the inclination angle θ is converted to a relative value Δθ with respect to the inclination angle θ corresponding to the initial value of the edge DC. Then, for each value of the center DC, a combination of the edge DC and the relative value Δθ is stored in the storage unit 97 as a second table. FIG. 12 is a diagram illustrating an example of a second table 975. In the second table 975, individual tables 977 are stored for voltage values 976 of the center DC, as illustrated in FIG. 12, for example. In each of the individual tables 977, the relative value Δθ (979) is stored in correspondence to the voltage value 978 of the edge DC. The second table 975 is an example of second data.

[Control of Edge DC]

Figure 13:
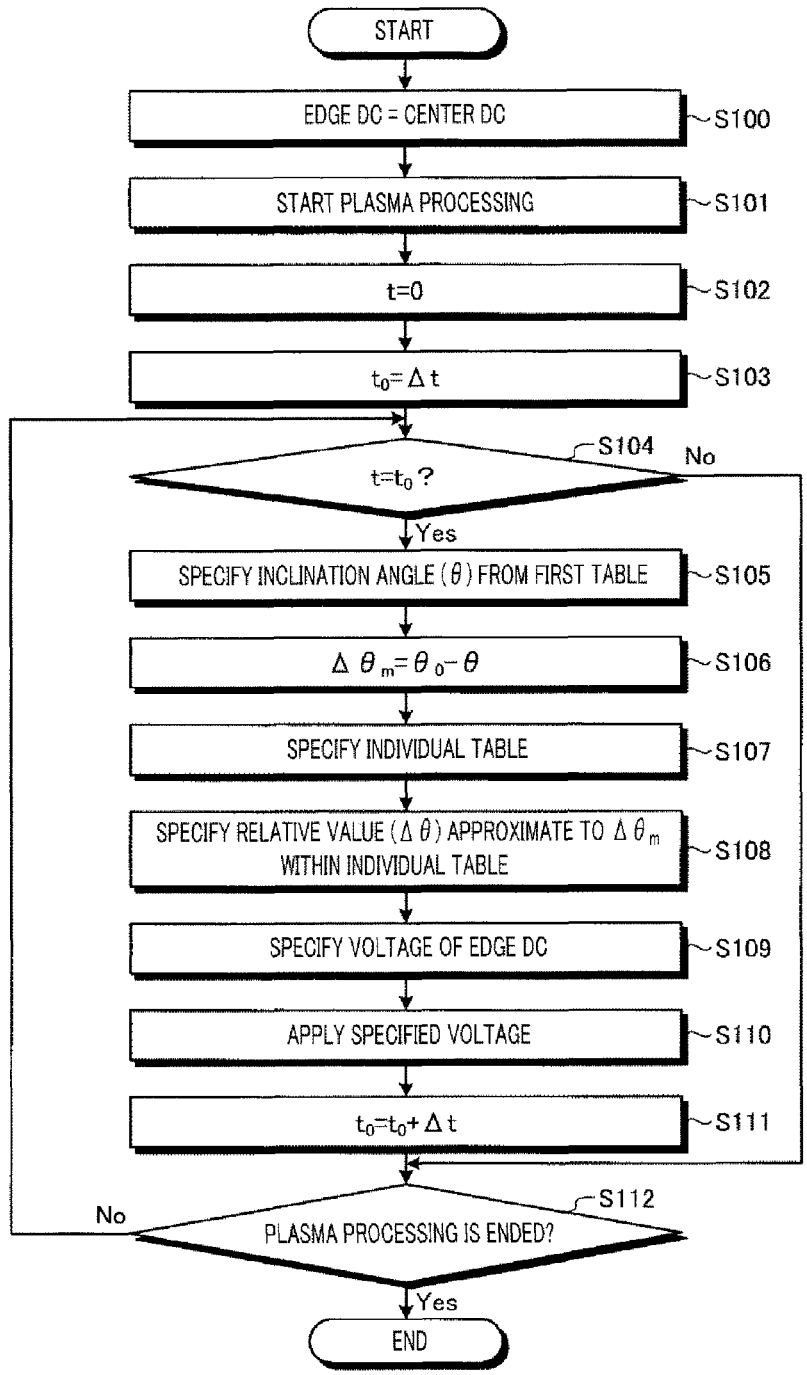
FIG. 13 is a flowchart for describing an example of an edge DC control process performed by the plasma processing apparatus.

FIG. 13 is a flowchart for describing an example of an edge DC control process performed by the plasma processing apparatus 1. Prior to starting the flowchart of FIG. 13, a semiconductor wafer W is carried into the chamber 10, and the internal pressure of the chamber 10 is controlled to a preset pressure by supplying the processing gas into the chamber 10. Further, the negative DC voltage specified in the processing recipe is applied to the electrode supporting body 38 as the center DC.

First, the controller 95 sets the edge DC to the same value as the center DC by controlling the variable DC power supplies 48a and 48b (S100). Accordingly, the negative DC voltage having the same magnitude as the negative DC voltage applied to the electrode supporting body 38 is applied to the second electrode plate 35.

Subsequently, the controller 95 applies the preset high frequency powers to the mounting table 16 by controlling the first high frequency power supply 89 and the second high frequency power supply 90. Accordingly, the plasma of the processing gas is generated within the chamber 10, and the plasma processing upon the semiconductor wafer W is begun by the generated plasma (S101).

Then, the controller 95 initializes an elapsed time t indicating the accumulation time of the plasma processing to zero (0) (S102). Further, the controller 95 also initializes a time $t_0$ indicating a timing for updating the edge DC to a preset time Δt (S103). The preset time Δt is, for example, 10 hours.

Thereafter, the controller 95 determines whether the elapsed time t has reached the time $t_0$ (S104). If the elapsed time t has not reached the time $t_0$ yet (S104: No), the controller 95 performs a process S112.

Meanwhile, if the elapsed time t has reached the time $t_0$ (S104: Yes), the controller 95 specifies the inclination angle θ corresponding to the current elapsed time t by referring to the first table 970 within the storage unit 97 (S105). Then, the controller 95 calculates a difference $\Delta\theta_m$ between the specified inclination angle θ and a predetermined inclination angle $\theta_0$ (S106). Here, the predetermined inclination angle $\theta_0$ means an inclination angle as a reference. In the present exemplary embodiment, the inclination angle $\theta_0$ is, for example, +0.5 deg.

Subsequently, the controller 95 specifies the individual table 977 corresponding to the center DC applied to the electrode supporting body 38 by referring to the second table 975 within the storage unit 97 (S107). Then, the controller 95 specifies, within the specified individual table 977, the relative value Δθ closest to the difference $\Delta\theta_m$ calculated in the process S106 (S108).

Thereafter, by referring to the individual table 977, the controller 95 specifies the voltage value of the edge DC corresponding to the relative value Δθ specified in the process S108 (S109). Then, the controller 95 controls the variable DC power supply 48b to output the negative DC voltage having the specified voltage value. Accordingly, the negative DC voltage having the voltage value specified in the process S109 is applied to the second electrode plate 35 (S110).

Afterwards, the controller 95 adds the preset time Δt to the time $t_0$ indicating the timing for updating the edge DC (S111), and determines whether to end the plasma processing (S112). In case of not ending the plasma processing (S112: No), the controller 95 performs the process S104, again. Meanwhile, in case of ending the plasma processing (S112: Yes), the plasma processing apparatus 1 ends the edge DC control process explained in the present flowchart.

So far, the present exemplary embodiment has been described. As clearly seen from the above description, by using the plasma processing apparatus 1 according to the present exemplary embodiment, it is possible to suppress the change in the inclination of the hole which might be caused by consumption of the focus ring 24a.

Further, the present disclosure is not limited to the above-described exemplary embodiment, and various changes and modifications may be made.

By way of example, in the above-described exemplary embodiment, the upper electrode 34 is equipped with the first electrode plate 36 and the second electrode plate 35, and the negative DC voltage, which is controlled independently from the negative DC voltage applied to the first electrode plate 36, is applied to the second electrode plate 35. However, the present disclosure is not limited thereto. By way of example, the second electrode plate 35 may include a multiple number of annular members in a radial direction, and negative DC voltages respectively applied to the individual annular members may be independently controlled.

With this configuration, a sheath distribution near the peripheral portion of the semiconductor wafer W can be controlled more precisely.

Furthermore, the above exemplary embodiment has been described for the plasma processing apparatus 1 configured to perform the etching process on the semiconductor wafer W by using the plasma, the present disclosure is not limited thereto. That is, the above-described edge DC control method can be applied to various other kinds of apparatuses such as a film forming apparatus and an apparatus configured to modify a film formed on the semiconductor wafer W by using plasma as long as they are configured to perform a processing by using plasma.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A plasma processing method performed by a plasma processing apparatus,
    wherein the plasma processing apparatus comprises:
        a chamber;
        a mounting table, provided within the chamber, having a mounting surface on which a processing target substrate is mounted;
        a focus ring provided around the mounting table to surround the mounting surface;
        a first upper electrode, provided above the mounting table, facing the mounting surface; and
        a second upper electrode which is provided around the first upper electrode to surround the first upper electrode and is insulated from the first upper electrode, and wherein the plasma processing method comprises:
            a first process of performing a preset processing on the processing target substrate mounted on the mounting surface with plasma generated within the chamber;
            a second process of increasing an absolute value of a negative DC voltage applied to the second upper electrode depending on an elapsed time of the first process so as to suppress a change in an inclination angle of a hole formed in the vicinity of an edge of the processing target substrate which is caused by a consumption of the focus ring;
            storing, by the plasma processing apparatus, first data indicating the inclination angle of the hole with respect to the elapsed time of the first process and second data indicating the inclination angle of the hole with respect to the absolute value of the negative DC voltage applied to the second upper electrode; and
            determining, by the plasma processing apparatus, in the second process, the absolute value of the negative DC voltage applied to the second upper electrode based on the first data and the second data.

2. The plasma processing method of claim 1,
    wherein the storing the second data includes storing the second data for each of values of DC voltages applied to the first upper electrode, and
    wherein the determining the absolute value of the negative DC voltage applied to the second upper electrode comprises:
        specifying, by the plasma processing apparatus, in the second process, the second data corresponding to the value of the DC voltage applied to the first upper electrode, and
        determining, by the plasma processing apparatus, the absolute value of the negative DC voltage applied to the second upper electrode based on the specified second data and the first data.

3. The plasma processing method of claim 1,
    wherein the first process comprises applying a first negative DC voltage to the first upper electrode and applying a second negative DC voltage having the same magnitude as the first negative DC voltage to the second upper electrode, and
    the second process comprises increasing an absolute value of the second negative DC voltage when the elapsed time has reached a predetermined time.

* * * * *